United States Patent
Yoshidome

(10) Patent No.: US 10,547,758 B1
(45) Date of Patent: Jan. 28, 2020

(54) DOCUMENT-PLACEMENT ASSISTING PLATEN ASSEMBLY

(71) Applicant: Kyocera Document Solutions Inc., Osaka (JP)

(72) Inventor: Gin Yoshidome, San Ramon, CA (US)

(73) Assignee: Kyocera Document Solutions Inc., Osaka (JP)

( * ) Notice: Subject to any disclaimer, the term of this patent is extended or adjusted under 35 U.S.C. 154(b) by 0 days.

(21) Appl. No.: 16/132,363

(22) Filed: Sep. 15, 2018

(51) Int. Cl.
*H04N 1/00* (2006.01)
*G03F 7/20* (2006.01)
*G09B 21/00* (2006.01)

(52) U.S. Cl.
CPC ....... *H04N 1/0066* (2013.01); *G03F 7/70858* (2013.01); *G09B 21/004* (2013.01); *H04N 1/00663* (2013.01); *H04N 1/00981* (2013.01); *H04N 1/00986* (2013.01); *H04N 2201/0094* (2013.01)

(58) Field of Classification Search
CPC ............... H04N 1/0066; H04N 1/0079; H04N 1/00663; H04N 1/00681; H04N 1/00702; H04N 1/00748; H04N 1/00761; H04N 1/00785; H04N 1/00787; H04N 1/00795; H04N 1/00986; H04N 2201/0098; G03G 21/1614; G03G 2215/00172; G03G 2215/00177; G03G 2215/00185; G03G 2215/00194; G03G 2215/00198; G03G 2215/00202; G03G 2215/00337
See application file for complete search history.

(56) References Cited

U.S. PATENT DOCUMENTS

| | | | |
|---|---|---|---|
| 2005/0286092 A1* | 12/2005 | Choi ................ | H04N 1/00986 358/474 |
| 2007/0103735 A1* | 5/2007 | Ikeno ................ | H04N 1/00681 358/449 |
| 2010/0149603 A1* | 6/2010 | Maeda ............... | H04N 1/00681 358/449 |

FOREIGN PATENT DOCUMENTS

JP 2008-053822 A 3/2008

* cited by examiner

*Primary Examiner* — Thomas S Giampaolo, II
(74) *Attorney, Agent, or Firm* — James Judge

(57) ABSTRACT

A platen assembly in an image-forming device is designed to assist visually impaired users in situating a document into the home corner of the platen. The platen assembly has a pair of placement-assisting thermal strips disposed extending along intersecting sides of the platen. A temperature gradient is established in the thermal strips, by a warming source provided at common ends of the thermal strips, by the thermal strips being an electrical-resistance heating material and a cooling structure or device being provided at common ends of the strips, or by the thermal strips substantially consisting of a thermoelectric material. To further assist a user in situating a document on the platen, the assembly may feature a raised edge extending from the home corner of the platen, along where the pair of placement-assisting thermal strips meet, as well as Braille written strategically on the thermal strips to direct toward the document-orienting corner.

20 Claims, 5 Drawing Sheets

US 10,547,758 B1

DOCUMENT-PLACEMENT ASSISTING PLATEN ASSEMBLY

FIELD OF THE INVENTION

The present disclosure relates to document-image reproduction by scanning capture of image-containing areas of original documents to generate image-representative signals or data for reproducing the scanned image-containing areas of the original documents. In particular, the disclosure relates to platens or like original-document holders in devices for such reproduction of document images by scanning capture.

BACKGROUND

Some users of a photocopier or scanner might encounter difficulties orienting an original document or picture on the device, in that conventional device designs are predicated on the user, as the reader or viewer of what they photocopy or scan, being able to visually confirm the document's or picture's orientation just as they can read or view the photocopied or scanned document or picture without visual-assisting enhancement. Yet visually impaired persons may not be the reader or viewer of what they photocopy or scan; for example, they may need to make or scan a copy of some official document for an administrative purpose, or may desire to make or scan a copy of a picture to share with friends or family. Or visually impaired persons may need to make a document or picture photocopy or scanned copy that assists them with a viewing impairment that itself makes using the photocopier or scanner difficult for them. That is, a visually impaired person may for example wish to take advantage of the magnifying capabilities of a photocopier or scanner—or a multifunction peripheral (MFP) capable of photocopying and scanning as well as other functions—to enlarge a given document or picture such as to make the document or picture readable or viewable to that person. In operating a photocopier, scanner, or MFP, however, such users may come up against difficulties in orienting the document or picture on the machine. Such users may be particularly inconvenienced in trying to place, as a document, a book or magazine in proper position on the machine.

In photocopiers, scanners, and MFPs ("image-forming devices" hereinafter), the scanning both for print-reproducing a document or picture, and for producing as image data a scanned copy of the document or picture is optical, via a light source and associated scanning optics, and a document-retaining table in the image-forming device containing a rectangular plate that is transparent, usually of glass, known as a platen. The light source and associated scanning optics operate beneath the transparent platen to scan the document or picture situated face-down on the platen. The entirety of the document-retaining table is not occupied by the platen; a nontransparent frame with sides of a given width holds the platen. The contrast between the transparency of the platen and the opacity of the frame provides a visual guide to orienting a document on the platen.

The image-forming device translates the scanning optics rectangularly, i.e., relative to the x- and y-axes of the platen. Correctly oriented reproduction therefore requires correctly orienting the document or picture relative to the platen. Thus, in placing a document or picture on the document-retaining table and orienting it on the platen, a visually impaired user could have difficulty not only in locating the platen relative to the surrounding frame, but more critically, in two-dimensionally situating the document in the x- and y-axis orientations of the platen.

Image-forming devices with features designed to assist visually impaired users are known. For example, machines that provide voice guidance, as well as that allow a user to execute certain functions of the machine via voice-actuated control are known. Image-forming devices that convert scanned text to audio data are known, but such technology presumes that the scanning is carried out on a document that is correctly oriented on the platen—such audio data of course does not assist in placing the document on the document-retaining table. And an image-forming device that automatically switches between single-sided and double-sided copying/scanning modes to assist visually impaired users has been proposed. That is, visually-dependent, manual switching between single-/double-sided copying modes is rendered unnecessary by enabling the machine to decide automatedly, through a stack of sheets constituting an original document, between single-sided and double-sided copying/scanning by detecting whether a current sheet side is blank.

Such sheet-stack scanning is carried out via an automatic document feeder (ADF) that feeds the document into scanning position on the platen, meaning that the document in its entirety is set onto the ADF feeder tray. While it may be easier for a visually impaired person to place a document on an ADF feeder tray than to situate a document on a platen, ADF use is essentially limited to documents constituted by a uniform stack of sheets. Books of course are out of the question. Even if otherwise the ADF is used for single-sheet document feeding, the single sheet still must be carefully placed on the feeder tray. And if the document is odd-sized or of a size different from the document last fed through the ADF, the adjustable sheet guides flanking the feeder tray must be repositioned. These difficulties mean that a visually impaired person is unlikely to employ an ADF except in extremely limited cases.

What is needed, then, is an imaging-device document-retaining table and associated scheme to assist visually impaired users in situating an original document on the document-retaining table.

SUMMARY

In some embodiments, a document-placement assisting platen assembly in accordance with the present disclosure is configured for an image-forming device such as an MFP, and comprises: a transparent rectangular platen defining a document-orienting home corner, and a pair of placement-assisting thermal strips disposed extending x-axially and y-axially alongside the platen, meeting bias or orthogonally at the home corner of the platen, and in which a temperature gradient is established. In some embodiments, the document-placement assisting platen assembly further features a raised edge extending from the home corner, along where the pair of placement-assisting thermal strips meet.

In some embodiments, the temperature gradient is established in the placement-assisting thermal strips by a warming source provided at common ends of the thermal strips. The warming source may be a dedicated device, or may be passively obtained by ducting ambient heat from a component(s) of the image-forming device to the common ends of the thermal strips. In other embodiments, heatsinks as well as a cooling fan(s) are provided at common ends of the strips opposite from the warming source, to enhance the temperature gradient.

In some embodiments not employing a warming source, the placement-assisting thermal strips substantially consist of an electrical-resistance heating material. In such embodiments, the temperature gradient may be set up by a cooling means provided at common ends of the strips opposite from the warming source.

In still other embodiments, the placement-assisting thermal strips substantially consist of a thermoelectric material, such that the strips themselves establish the temperature gradient.

From the following detailed description in conjunction with the accompanying drawings, the foregoing and other objects, features, aspects and advantages of the present invention will become readily apparent to those skilled in the art.

BRIEF DESCRIPTION OF THE SEVERAL VIEWS OF THE DRAWINGS

The following drawings illustrate examples of various components of embodiments of the invention disclosed herein, and are for illustrative purposes only.

DETAILED DESCRIPTION

The illustrative block diagrams and flowcharts depict process steps or blocks that may represent assemblies, segments, or portions of code that include one or more executable instructions for implementing specific logical functions or steps in the process. Although the particular examples illustrate specific process steps or procedures, many alternative implementations are possible. Some process steps may be executed in different order from the specific description herein based on, for example, considerations of function, purpose, conformance to standard, legacy structure, user interface design, and the like.

Figure 1:
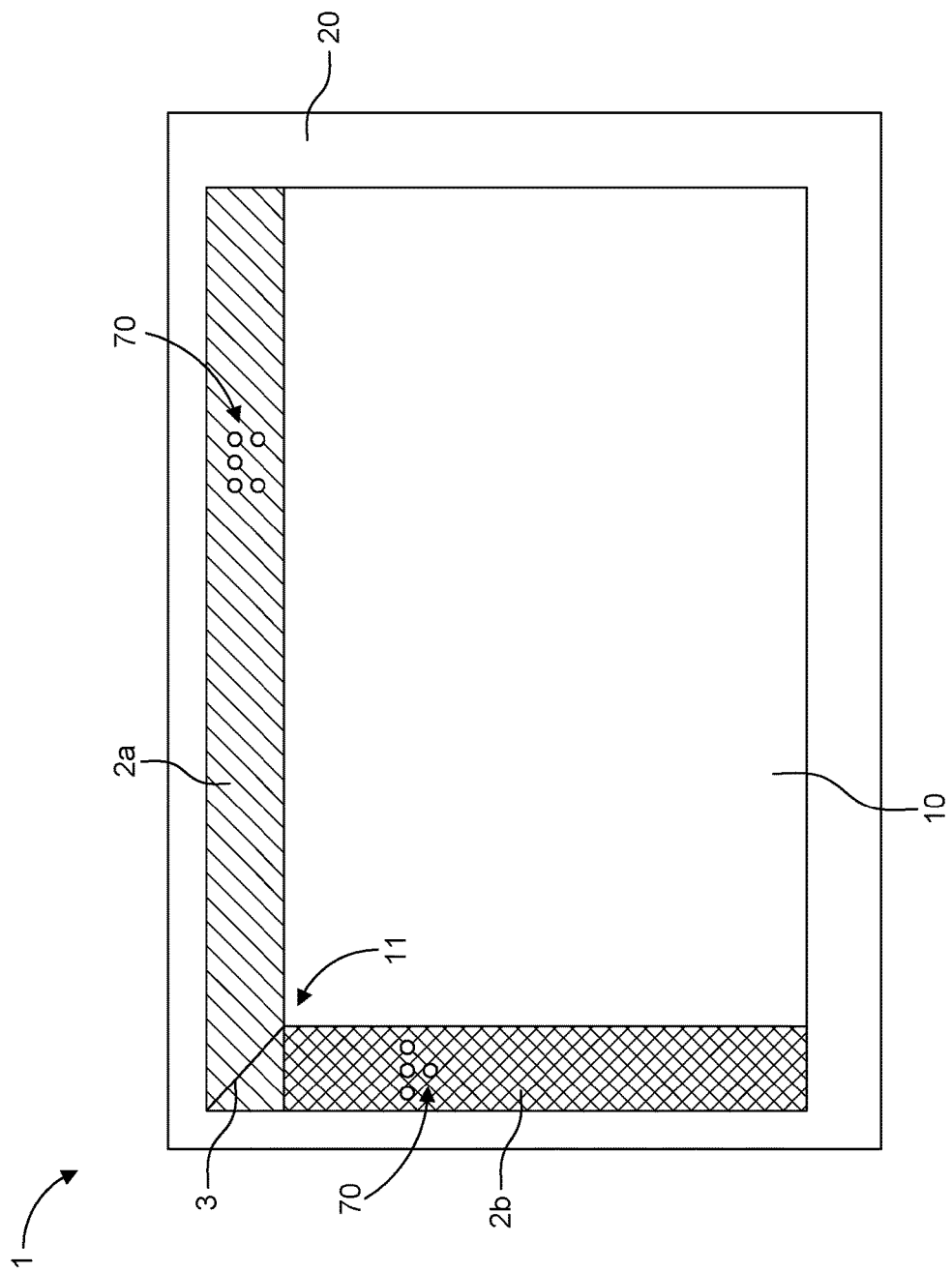
FIG. 1 is a schematic diagram representative of a platen assembly according to the present disclosure.
Figure 2:
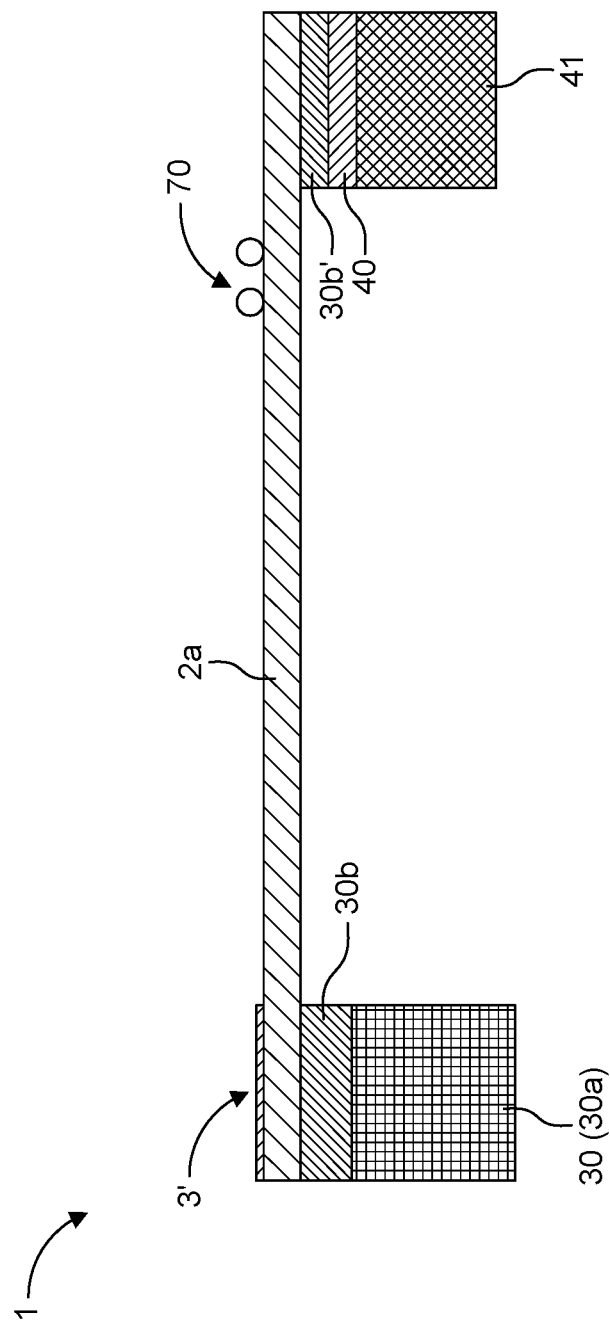
FIG. 2 is a sectional schematic diagram representative of the platen assembly depicted in FIG. 1, illustrating a warming source and cooling means as constituent components of the platen assembly.

In one embodiment, a document-placement assisting platen assembly 1 (simply "platen assembly 1" hereinafter) as illustrated in FIG. 1 principally includes a transparent platen 10, which may be of glass, and a frame 20, as fundamental components constituting a document-retaining table of an image-forming device—representative of which, as noted earlier, are photocopiers, scanners, and MFPs. In this embodiment the platen assembly 1 is furnished in a copying- and scanning-functional image-forming device, which may be an MFP. A further principal component of the platen assembly is, as illustrated in FIG. 2, a warming source 30.

The platen 10 is a rectangular, defining a document-orienting corner 11 of the platen where an x-axis, horizontal in FIG. 1, along one of opposing sides of the platen 10, and ay-axis, vertical in FIG. 1, along the other of opposing sides of the platen 10 intersect. This document-orienting corner 11 is the upper left, in the drawing, of the four vertices of the outlining rectangle that the platen 10 defines, as is typical of image-forming device platens—because the design favors righthandedness and a pushing-away action rather than a drawing-toward action for orienting a document on the platen—but the document-orienting corner of course may be any of the other three vertices of the platen's outlining rectangle.

The platen assembly 1 further includes a pair of thermally conductive strips, an x-axis strip 2a and a y-axis strip 2b. The x-axis strip 2a is disposed extending platen-widthwise, that is, x-axially, while the y-axis strip 2b is disposed extending platen depth-wise, that is, y-axially, alongside the platen 10. The x-axis and y-axis strips 2a and 2b thus meet bias orthogonally at the upper-left, document-orienting corner 11 of the platen. Herein "meet bias or orthogonally" means that the seam where the thermal strips 2a and 2b meet is either slanted, or at or nearly at a right angle with respect to the upper-left document-orienting corner 11 of the platen 10.

Along the seam where the x-axis and y-axis strips 2a and 2b meet, a raised edge 3 is provided. A document-placement assist feature of the platen assembly 1, the raised edge 3 tactilely guides a user as to where to place a given corner of a document relative to the platen glass. That is, the raised edge 3 assists in guiding a user to the upper-left, document-orienting corner 11 of the platen 10. In certain embodiments, the raised edge 3 is along the diagonal that bisects the rectangle or square where the x-axis and y-axis strips 2a and 2b overlap extended geometrically, if not physically. The raised edge 3 does not have to follow this diagonal, and may be any angle, preferably acute. Nonetheless, the raised edge 3 preferably originates at the upper-left vertex of the platen's outlining rectangle and extends diagonally to the outside corner between the x-axis and y-axis strips 2a and 2b.

The thermal strips 2a and 2b function to guide placement tactilely by setting up a heat differential, i.e., a temperature gradient, from one longitudinal end to the other. In some embodiments, the longitudinal ends where the thermal strips 2a and 2b meet at the raised edge 3 are relatively warmer, the opposite longitudinal ends relatively cooler. Accordingly, the warm corner can be found single-handedly as a convergence along the two rectangular directions. The x-axis and y-axis strips 2a and 2b thus are a further document-placement assistance feature of the platen assembly 1, and in that role extend along the x-axis and y-axis of the platen 1 either end-to-end respectively along the two sides, as FIG. 1 indicates, or to some predetermined, suitable length. Since their extensiveness is an important aspect of their guiding function, the x-axis and y-axis strips 2a and 2b preferably are rectangular, but are not so limited and may be, for example, in the form of strips having non-rectangular or non-rectilinear geometries. The thermal strips 2a and 2b preferably are of a metal having a relatively high thermal conductivity κ, such as copper, aluminum, brass, and silver, or are of alloys thereof or of other suitable metals. The strips 2a and 2b can also be nonmetal thermal conductors.

The warming source 30 as represented in FIG. 2 may be, as an active source, a dedicated device, or may be, as a passive source, heat given off and ducted from a functional (i.e., heat-producing, nonstructural) component(s) of the MFP. The dedicated device as the warming source 30 may be, for example, any electric heating device such as an electrical resistance heater. The MFP functional component(s) providing heat to the warming source 30 may be, for example, the light source for the scanning optics, the mother board for the MFP's control system, or any of the various motors that drive the scanning optics, and the belts/rollers, drums, and other mechanisms associated with moving copy sheets through the MFP and carrying out print-reproducing processes on the sheets. Thus, in embodiments where the warming source 30 is passive, it is not functional until the MFP warms up and the temperature of the warming source increases relative to the ambient temperature.

As will be understood from the drawing, FIG. 2 is a section view longitudinally through the x-axis strip 2*a* of the platen assembly 1. In the embodiment illustrated in FIG. 2, the warming source 30 is an electric heating unit 30*a* disposed beneath the platen 10 corner where the x-axis and y-axis strips 2*a* and 2*b* meet (i.e., below the raised edge 3—"raised-edge platen corner 3'" hereinafter). In addition to the electric heating unit 30*a*, the warming source 30 in this embodiment preferably further comprises a first thermal interface material 30*b* between the electric heating unit 30*a* and the raised-edge platen corner 3'. The first thermal interface material 30*b* may be, for example, thermal grease, thermal adhesive, thermal filler, or a thermally conductive pad, or a suitable combination of any of these materials.

In some embodiments, the platen assembly 1 includes, in addition to the warming source 30, heatsinks 40 to enhance the temperature gradient of the x-axis and y-axis strips 2*a* and 2*b* by transferring away heat from, thereby cooling, the longitudinal ends opposite the raised-edge platen corner 3'. At least a pair of such heatsinks 40, one beneath each longitudinally opposite end of the thermal strips 2*a* and 2*b*, may be furnished. In certain embodiments, the heatsinks 40 are made of a copper-based material.

Figure 3:
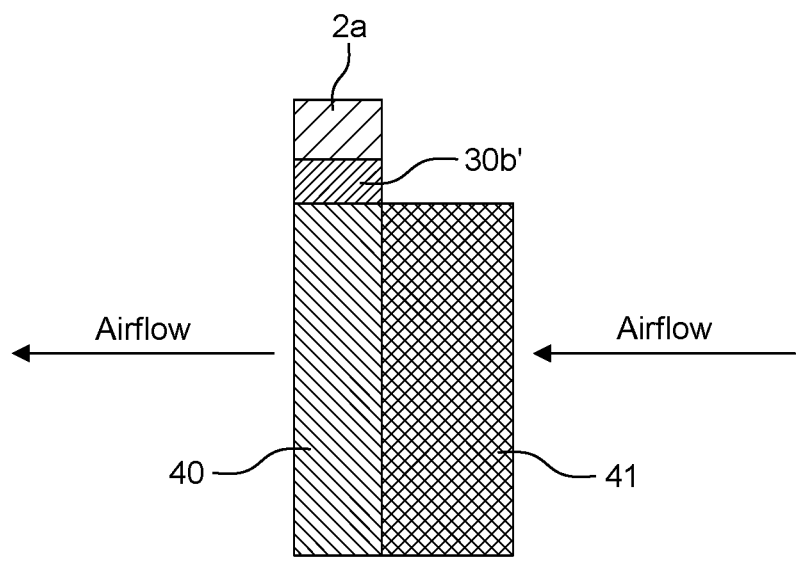
FIG. 3 is a schematic diagram representative of a heatsink and cooling fan in an alternative arrangement of a cooling-means component of a platen assembly according to the present disclosure.

Furthermore, in certain implementations of the platen assembly 1, a cooling fan 41 is provided beneath each heatsink 40 to dissipate heat from the heatsink fins, in an arrangement typical of a desktop-CPU cooling configuration. In other implementations, the cooling fans 41 are disposed laterally of the heatsinks 40, as illustrated in FIG. 3, schematically for one of the heatsinks 40. In still other implementations, a single cooling fan 41 may be suitably disposed intermediate the thermal strips 2*a* and 2*b* with associated ducting to blow heat-dissipating air on the heatsinks 40. As indicated in FIG. 2 as well as FIG. 3, the heatsinks 40 preferably are thermally coupled to the corresponding opposite ends of the thermal strips 2*a* and 2*b* by second thermal interface material 30*b*'. Also, since MFPs often have cooling fans built into their design, one or more of such fans, if sufficiently close to the longitudinally opposite ends of the thermal strips 2*a* and 2*b*, may be made dual-functional to perform its original cooling function and to cool the heatsinks 40 as well.

Figure 4:
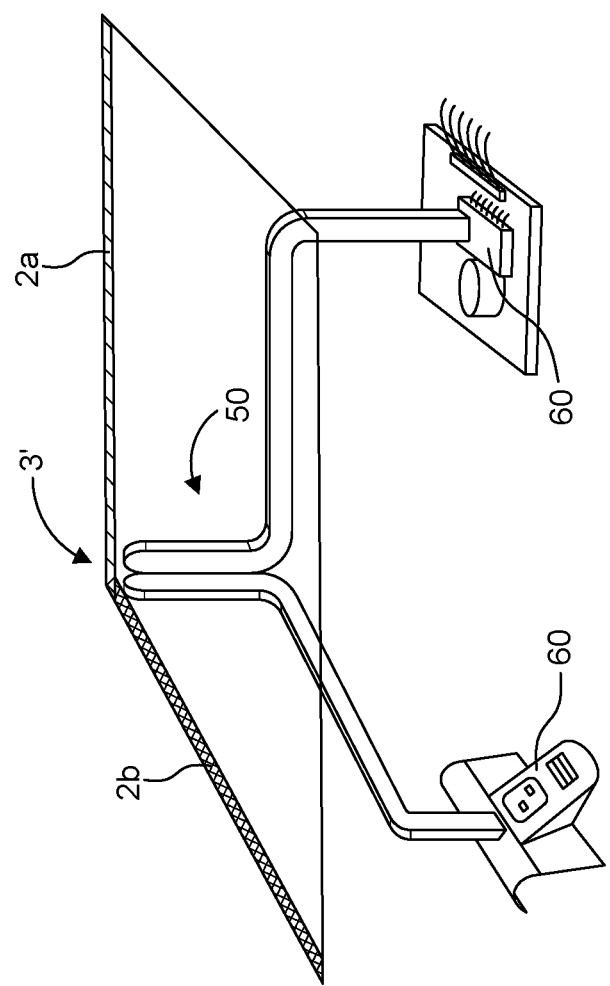
FIG. 4 is a schematic diagram representative of an alternative embodiment of a warming source component of a platen assembly according to the present disclosure.

In platen assembly 1 implementations in which the warming source is passive, the warming source comprises a duct system 50, as indicated in FIG. 4, for ducting heat from MFP functional component(s) 60 to the raised-edge platen corner 3'. The duct system 50 may be a heat pipe(s), for example.

Alternative Embodiments

Figure 5:
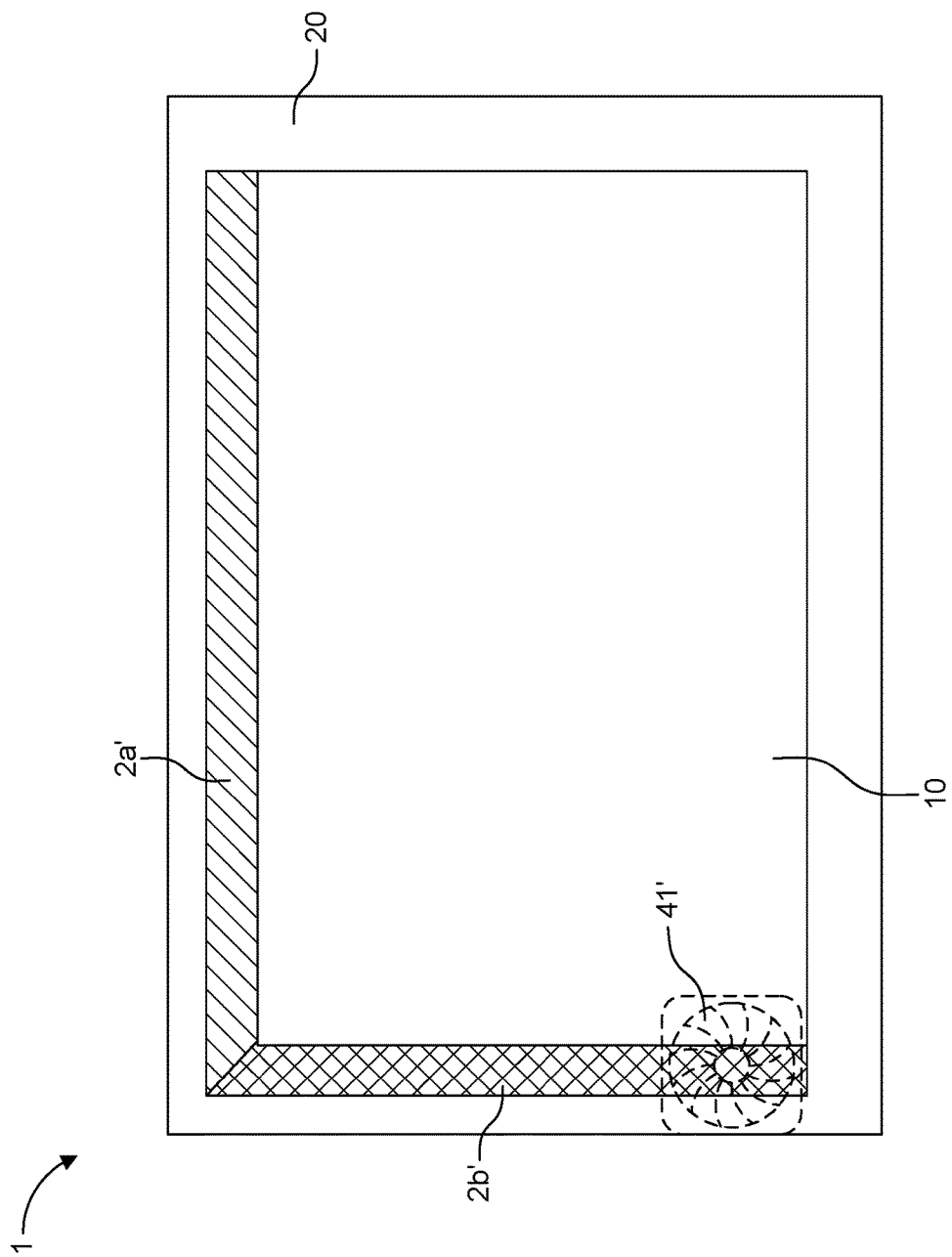
FIG. 5 is a schematic diagram representative of an alternative embodiment of a platen assembly according to the present disclosure.

The present disclosure also comprehends embodiments in which the x-axis and y-axis strips themselves function as a warming source, by being electrical resistance heating elements. For example, as indicated in FIG. 5, thermal strips 2*a*' and 2*b*' are constituted by electrical resistance heating strips made of a resistance heating alloy such as nichrome. In such implementations, a power source, not illustrated, supplies a suitable current to the thermal strips 2*a*' and 2*b*', but since the entire strips are warmed by Joule heating, a cooling means such as the above-described heatsinks, optionally together with associated cooling fans 41' (only one is represented, by hidden lines, in FIG. 5), for cooling the longitudinal ends of the strips 2*a*' and 2*b*' opposite the raised-edge platen corner 3' should be furnished.

Instead of above-described heatsinks and cooling fans, a thermoelectric cooling device may be employed for the cooling means. For example, the electrical resistance heating strips may be utilized in conjunction with (not-illustrated) Peltier elements along the longitudinally opposite ends of the thermal strips 2*a*' and 2*b*' to provide thermoelectric cooling as an alternative to the passive cooling provided by heatsinks and fans.

It will also be appreciated that the entire the x-axis and y-axis strips may be constituted by a thermoelectric material to set up a temperature gradient in the strips by exploiting thermoelectric effects.

Certain implementations of any of the above-described warming sources include a (not-illustrated) temperature safety mechanism that prevents the temperature of the x-axis andy-axis strips from surpassing a preset temperature, for example 37° C. The temperature safety mechanism may be as simple as a thermal fuse, or may be, for example, a resettable temperature limit controller that preferably is adjustable.

A still further document-placement assist feature of the platen assembly 1 is the provision of Braille character sets along the x-axis and y-axis strips. In such embodiments, the Braille markings 70, usually raised dots like those indicated in FIG. 1, may be strategically placed and written to convey assistive instructions such as the following.

Halfway, move more to the left (x-axis strip)
    Halfway, move more to the top (y-axis strip)
    Move to the left (x-axis strip)
    Move to the top (y-axis strip)
Temperature Gradient According to Weber's Law concerning the psychophysics of sensory perception, there is a difference threshold, or "just-noticeable difference," that is the minimum change $\Delta I$ in intensity of a given stimulus that is sensorially perceptible by a subject. This minimum change relative to the intensity I of the stimulus is called the Weber fraction $\Delta I/I$ and was observed by Ernst Weber to be constant within given limits of human perception. As explained in, for example, L. A. Jones and M. Berris, "The Psychophysics of Temperature Perception and Thermal-Interface Design," *Haptic Interfaces for Virtual Environment and Teleoperator Systems, International Symposium on (HAPTICS)*, Orlando, Fla., 2002, pp. 137-142, August 2002, IEEE Computer Society, the Weber fraction "is 0.02 over a baseline skin temperature range of 29–41° C.," meaning that for timed cooling stimulus pulses over a 1-8° C. range, and warming stimulus pulses in a 4-6° C. temperature range, "subjects can discriminate a 2% change in temperature" (ibid., pp. 138 and 139). The authors also noted that this discriminatory ability varies with the temperature to which a subject's skin has been adapted beforehand; namely, "It is superior at skin temperatures near 34° C. and substantially impaired at adaptation temperatures of 29° C." (ibid.)

Hence, a preferred temperature gradient for the x-axis and y-axis strips of the present disclosure ranges, for example, from a warm-end temperature of about 33° C. at the raised-edge platen corner 3' to a longitudinally opposite, cool-end temperature of about 26-27° C., for a gradient that is roughly eight to ten times the foregoing Weber fraction for human temperature perception. The range upper limit is chosen as being comfortably near the human normal body temperature of around 37° C., while the lower limit is chosen to yield a 6-7° C. differential producing a gradient that is, as just noted, roughly eight to ten times the 0.02 Weber fraction. It will be appreciated that the temperature gradient is established through a combination of the thermal conductivity of the strips, as predetermined through selecting their material and composition, of the caloric output of the heater, in implementations in which the warming source is active, or the usable thermal energy ducted to the raised-edge platen corner 3', in implementations in which the warming source is passive, and of the specifications of the heatsinks and cooling fans as the cooling means. Likewise, in the alternative embodiments, the temperature gradient is established through a combination of the caloric output of the strips themselves, and of the level of operational effectiveness of the cooling means, or simply by the material of the strips themselves in implementations as described above in which the strips are constituted by a thermoelectric material.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A document-placement assisting platen assembly for an image-forming device, comprising:
   a transparent rectangular platen defining a document-orienting corner of the platen where an x-axis along one of opposing sides of the platen and a y-axis along the other of the opposing sides of the platen intersect;
   a pair of thermally conductive strips disposed extending x-axially and y-axially alongside the platen to meet bias or orthogonally at the document-orienting corner of the platen; and
   a warming source thermally coupled to the thermally conductive strips at the document-orienting corner of the platen.

2. The document-placement assisting platen assembly according to claim 1, further comprising a raised edge where the pair of thermally conductive strips meet.

3. The document-placement assisting platen assembly according to claim 1, further comprising a thermal interface material thermally coupling the warming source to the thermally conductive strips.

4. The document-placement assisting platen assembly according to claim 3, wherein the thermal conductivity of the thermally conductive strips, the thermal energy of the warming source, and functional specifications and disposition of the heatsinks are configured to establish a temperature gradient that is at least the Weber fraction for human temperature perception.

5. The document-placement assisting platen assembly according to claim 4, wherein the temperature gradient is at least 6° C.

6. The document-placement assisting platen assembly according to claim 1, further comprising a pair of heatsinks disposed adjacent respective ends of the thermally conductive strips opposite the document-orienting corner of the platen.

7. The document-placement assisting platen assembly according to claim 6, wherein the heatsinks are thermally coupled to the thermally conductive strips via a thermal interface material.

8. The document-placement assisting platen assembly according to claim 7, wherein the thermal conductivity of the thermally conductive strips, the thermal energy of the warming source, and functional specifications and disposition of the heatsinks and cooling fans are configured to establish a temperature gradient that is at least the Weber fraction for human temperature perception.

9. The document-placement assisting platen assembly according to claim 8, wherein the temperature gradient is at least 6° C.

10. The document-placement assisting platen assembly according to claim 6, further comprising a pair of cooling fans respectively adjacent the pair of heatsinks.

11. The document-placement assisting platen assembly according to claim 6, further comprising a fan ducted to the pair of heatsinks.

12. The document-placement assisting platen assembly according to claim 1, wherein the warming source is an electric heating unit.

13. The document-placement assisting platen assembly according to claim 1, wherein the warming source comprises a duct system configured to duct heat from a functional component of the image-forming device.

14. The document-placement assisting platen assembly according to claim 13, wherein the duct system is a heat pipe.

15. The document-placement assisting platen assembly according to claim 1, wherein the thermal conductivity of the thermally conductive strips and the thermal energy of the warming source are configured to establish a temperature gradient that is at least the Weber fraction for human temperature perception.

16. The document-placement assisting platen assembly according to claim 15, wherein the temperature gradient is at least 6° C.

17. The document-placement assisting platen assembly according to claim 1, wherein the thermally conductive strips each bear Braille directing toward the document-orienting corner.

18. The document-placement assisting platen assembly according to claim 1, wherein the warming source includes a temperature safety mechanism for preventing the temperature of the thermally conductive strips from surpassing a predetermined temperature.

19. A document-placement assisting platen assembly for an image-forming device, comprising:
   a transparent rectangular platen defining a document-orienting corner of the platen where an x-axis along one of opposing sides of the platen and a y-axis along the other of the opposing sides of the platen intersect;
   a pair of electrical resistance heating strips disposed extending x-axially and y-axially alongside the platen to meet bias or orthogonally at the document-orienting corner of the platen;
   a raised edge where the pair of thermally conductive strips meet; and
   a cooling means at respective ends of the pair of electrical resistance heating strips opposite from where the strips meet at the document-orienting corner of the platen.

20. A document-placement assisting platen assembly for an image-forming device, comprising:
   a transparent rectangular platen defining a document-orienting corner of the platen where an x-axis along one of opposing sides of the platen and ay-axis along the other of the opposing sides of the platen intersect;

a pair of temperature-gradient establishing strips of a thermoelectric material disposed extending x-axially and y-axially alongside the platen to meet bias or orthogonally at the document-orienting corner of the platen; and a raised edge where the pair of thermally conductive strips meet.

* * * * *